United States Patent
Yoshimura

(10) Patent No.: US 6,722,035 B1
(45) Date of Patent: Apr. 20, 2004

(54) METHOD OF MANUFACTURING AN INK EJECTING DEVICE WHEREIN ELECTRODES FORMED WITHIN NON-EJECTING CHANNELS ARE DIVIDED AND ELECTRODES FORMED WITHIN EJECTING CHANNELS ARE CONTINUOUS

(75) Inventor: Manabu Yoshimura, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/435,822

(22) Filed: Nov. 8, 1999

Related U.S. Application Data

(62) Division of application No. 08/743,045, filed on Nov. 4, 1996, now abandoned.

(30) Foreign Application Priority Data

Nov. 2, 1995 (JP) ............................................. 7-285694

(51) Int. Cl.[7] .............................. B21D 53/76; H05K 3/04
(52) U.S. Cl. ....................... 29/890.1; 29/25.35; 29/847; 29/DIG. 67; 216/17; 216/27; 216/41; 451/28; 347/68; 347/69
(58) Field of Search ............................. 29/890.1, 25.35, 29/846, 847, 852, DIG. 67, DIG. 96; 216/17, 18, 27, 41; 451/28; 347/69, 71, 68, 72, 94; 310/328

(56) References Cited

U.S. PATENT DOCUMENTS

| | | | |
|---|---|---|---|
| 3,946,398 A | | 3/1976 | Kyser et al. |
| 4,723,129 A | | 2/1988 | Endo et al. |
| 4,879,568 A | | 11/1989 | Bartky et al. |
| 5,016,028 A | * | 5/1991 | Temple ......................... 216/27 |
| 5,359,354 A | | 10/1994 | Hiraishi et al. |
| 5,432,540 A | | 7/1995 | Hiraishi |
| 5,625,393 A | | 4/1997 | Asai |
| 5,631,680 A | | 5/1997 | Sugahara |
| 5,680,163 A | | 10/1997 | Sugahara |
| 5,754,203 A | | 5/1998 | Kinoshita |
| 5,801,731 A | | 9/1998 | Takahashi |
| 6,070,310 A | * | 6/2000 | Ito et al. ..................... 29/890.1 |

FOREIGN PATENT DOCUMENTS

| | | |
|---|---|---|
| EP | 566 244 A2 | 10/1993 |
| GB | 2 264 086 A | 8/1993 |
| JP | 63-92460 | 4/1988 |
| JP | A-6-8450 | 1/1994 |
| JP | 7-276628 | 10/1995 |
| JP | 10-193598 | * 7/1998 |

OTHER PUBLICATIONS

Chen et al, "A High–Resolution Silicon Monolithic Nozzle Array for Inkjet Printing", IEEE Transactions on Electron Devices, vol. 44, No. 9, pp. 1401–1409, Sep. 1997.*

Full English Translation of JP 6–8450, Mizutani, Manufacture of Ink Jet Head, Jan 1994.*

* cited by examiner

Primary Examiner—A. Dexter Tugbang
(74) Attorney, Agent, or Firm—Oliff & Berridge, PLC

(57) ABSTRACT

A method of manufacturing a substrate of an ink ejecting device in which an electrode formed at the bottom surface of an air chamber is removed with a diamond disk, without erroneously removing an electrode formed at an actuator forming the internal surface of the air chamber, by forming the air chamber with a width not smaller than that of an ink channel. The diamond disk for removing the bottom surface of the electrode of the air chamber may be the same as or have the same dimensions (width) as the ink channel.

24 Claims, 7 Drawing Sheets

METHOD OF MANUFACTURING AN INK EJECTING DEVICE WHEREIN ELECTRODES FORMED WITHIN NON-EJECTING CHANNELS ARE DIVIDED AND ELECTRODES FORMED WITHIN EJECTING CHANNELS ARE CONTINUOUS

This is a Division of Application Ser. No. 08/743,045 filed Nov. 4, 1996 now abandoned. The entire disclosure of the prior application is hereby incorporated by reference herein in its entirety.

BACKGROUND OF THE INVENTION

1. Field of the Invention

The present invention relates to an ink ejecting device and a method for manufacturing the ink ejecting device.

2. Description of Related Art

Among nonimpact type printers, which have expanded the market in part by obsoleting existing impact type printers, an ink jet printer is simplest in principle and easily realizes color printing in multiple gradation. Particularly, the use of drop-on-demand type printers, which eject ink droplets for printing, is rapidly spreading because of their excellent efficiency of ejection and lower operation cost.

A typical drop-on-demand type printer includes a Kyser type disclosed in U.S. Pat. No. 3,946,398 and a thermal jet type disclosed in U.S. Pat. No. 4,723,129. However, those conventional printers have difficult problems. The Kyser type printer is difficult to miniaturize, while the thermal jet type printer requires higher heat-proof characteristics of ink because intense heat is applied thereto.

To simultaneously overcome the above-mentioned defects, U.S. Pat. No. 4,879,568 has disclosed, as a novel system, a shear mode type printer.

The shear mode type printer introduces an ink driving method in which an electrode to which a voltage is applied is placed in contact with ink. Therefore, the shear mode type printer has always been accompanied by a disadvantage because an electrode must be covered with an insulating layer, resulting in increased cost and decreased productivity.

However, in recent years, a shear mode type printer having an ink driving method not utilizing an insulating layer has been proposed as a result of improvement in the shear mode type driving method.

For example, in the ink jet printer described in U.S. Pat. No. 4,879,568, an air chamber provided between ink channels is formed to have a narrower width than the ink channels to achieve higher integration of ink channels and printing resolution.

However, the above-mentioned prior art devices suffer from disadvantages since voltage is applied directly to the electrodes of the ink emitting chambers.

SUMMARY OF THE INVENTION

The present invention has been proposed to overcome the problems described above and it is therefore an object of the present invention to provide an ink ejecting device that can accurately remove electrodes at the bottom parts of grooves with lower cost and higher productivity. Another object is to provide a method of manufacturing an ink ejecting device.

According to a first aspect of the present invention, to achieve the object explained above, an ink ejecting device comprises a plurality of eject channels for ejecting ink, a plurality of non-eject channels provided in both sides of the eject channels that do not eject ink, separation walls at least partly formed of polarized piezoelectric ceramic to isolate the eject channels from the non-eject channels, and electrodes formed on the separation walls to generate an ink driving field at the piezoelectric ceramic with application of a voltage thereto, with the electrodes in the non-eject channels being divided such that the non-eject channels are wider than the eject channels.

According to a second aspect of the present invention, the ink ejecting device does not require any insulating film on the electrodes within the eject channels that are in contact with ink, by grounding the electrodes in the eject channels and applying a voltage to the electrodes in the non-eject channels.

According to a third aspect of the present invention, there is provided a method of manufacturing an ink ejecting device comprising a plurality of eject channels for ejecting ink, a plurality of non-eject channels provided in both sides of the eject channels that do not eject ink, separation walls at least partly formed of polarized piezoelectric ceramic to isolate the eject channels from the non-eject channels, and electrodes formed on the separation walls to generate an ink driving field to the piezoelectric ceramic with application of a voltage thereto. The method includes dividing the electrodes in the non-eject channels by forming on a substrate having a piezoelectric ceramic layer first grooves that define the eject channels, second grooves, which are wider than the first grooves, to define the non-eject channels, and the separation walls; forming a conductive layer along all of the internal surfaces of the first and second grooves; and removing the conductive layers formed at the bottom surfaces of the second grooves.

According to a method of manufacturing an ink ejecting device of a fourth aspect of the present invention, the conductive layers formed at the bottom surfaces of the second grooves having the width wider than that of the first grooves can be removed by cutting thereof with a rotating disk tool, thereby dividing the electrodes in the non-eject channels.

According to a method of manufacturing an ink ejecting device of a fifth aspect of the present invention, the electrodes in the non-eject channels can be divided with good productivity by forming the first grooves and removing the conductive layers by using rotating disk tools having the same width.

As is apparent from above description, in the ink ejecting device of the first aspect, since the non-eject channel is wider than the eject channel, the electrodes in the non-eject channel can be divided reliably. Therefore, cost reduction can be realized, manufacturing yield can be improved and higher productivity can also be attained.

In the ink ejecting device of the second aspect, since the electrodes in the eject channels are grounded and the ink can be ejected by applying a voltage to the electrodes in the non-eject channels to deform the separation walls, an insulating film on the electrodes in the eject channels to be placed in contact with the ink is no longer required, achieving reduction of cost, improvement of manufacturing yield and excellent productivity.

In the ink ejecting device of the third aspect, since the second groove that defines the non-eject channel is formed wider than the first groove that defines the eject channel, the conductive layer at the bottom surface of the second groove can be accurately removed, achieving lower cost, improvement in manufacturing yield and good productivity.

In the method of manufacturing an ink ejecting device of the fourth aspect, since the conductive layer formed at the bottom surface of the second groove formed wider than the first groove can be removed by the cutting process using a rotating disk tool, the electrodes in the non-eject channel can be divided accurately.

In the method of manufacturing an ink ejecting device of the fifth aspect, the electrodes in the non-eject channel can be divided with good productivity by forming the first groove and removing the conductive layer through the cutting process using rotating disk tools having the same width.

These and other aspects and advantages of the invention will be described in or apparent from the following detailed description of preferred embodiments.

BRIEF DESCRIPTION OF THE DRAWINGS

Preferred embodiments of the present invention will be described in detail with reference to the following figures wherein.

DETAILED DESCRIPTION OF PREFERRED EMBODIMENTS

Figure 1:
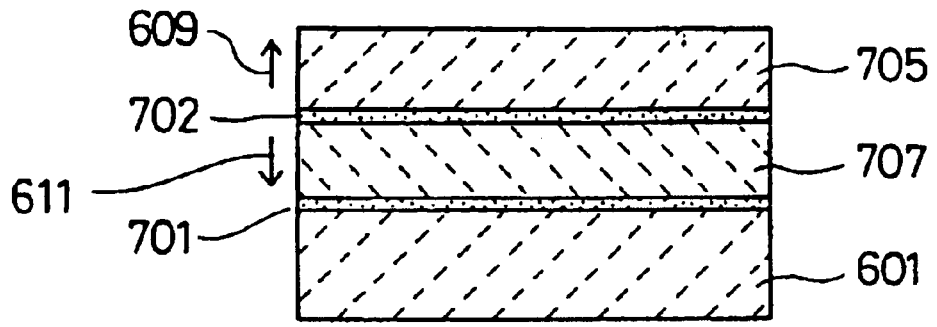
FIG. 1 is a cross-sectional view illustrating a manufacturing process of an ink ejecting device of a first embodiment of the present invention.

A first embodiment will be explained with reference to FIGS. 1 to 5. As shown in FIG. 1, a piezoelectric ceramic layer 707 polarized in the direction of an arrow mark 611 is bonded to a bottom wall 601 with an adhesive 701, and a piezoelectric ceramic layer 705 polarized in the direction of an arrow mark 609 is bonded to the piezoelectric ceramic layer 707 with an adhesive 702. In this case, the adhesive 702 should have a uniform thickness to obtain uniform drive characteristics of each actuator wall 603, and the thickness is determined to be within ±5 µm for a certain value in the first embodiment. Moreover, the adhesive layer 702 is selected to ensure sufficient bonding, while at the same time avoiding the formation of bubbles that are larger than the wall thickness of the actuator wall 603 to be subsequently formed.

Figure 2:
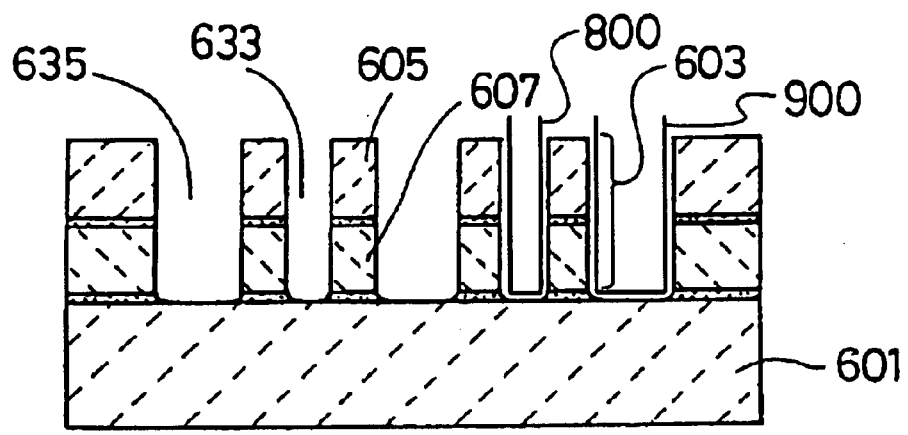
FIG. 2 is a cross-sectional view illustrating the manufacturing process of the ink ejecting device of the first embodiment.

Next, as shown in FIG. 2, first grooves 633 and second grooves 635 that define ink channels 613 and air chambers 615 (refer to FIG. 5), respectively, and the actuator walls 603 are formed on the bonded three-layer substrate. The first grooves 633 that define the ink channels 613 are formed from the side of the piezoelectric ceramic layer 705 with a first rotating diamond disk 800 having a width equal to the width of the ink channel 613. The first rotating disk 800 has a thickness between 40–100 µm. In this case, it is important to set the forming depth equal to that of the other first groove 633 and the absolute value of depth can be adequately set depending on the ejecting condition. In the first embodiment, the depth is set to a value that assures the best driving efficiency, that is, the grooves are formed up to the bottom wall 601.

Next, the second grooves 635 (which will become the air chambers 615) and the actuator walls 603 are formed. In this case, a second diamond disk 900 thicker than the disk used to form the first grooves 635 is used. The second disk 900 has a thickness of between 45–105 µm. Theoretically, a disk which is thicker than the disc used form the first grooves 635 will satisfy the subject matter of the present invention, but when a diamond disk is used as explained in this embodiment, it is desirable that the second diamond disk 900 have a width that is wider by about 5 µm than the first diamond disk 800 used to form the first grooves 633. If the width is smaller than such a value, electrodes may be removed erroneously because the second rotating diamond disk may be placed in contact with the electrodes formed on the actuator walls 603 when the electrodes on the bottom walls 601 forming the air chambers 615 (explained later) are cut with the diamond disk.

Figure 3:
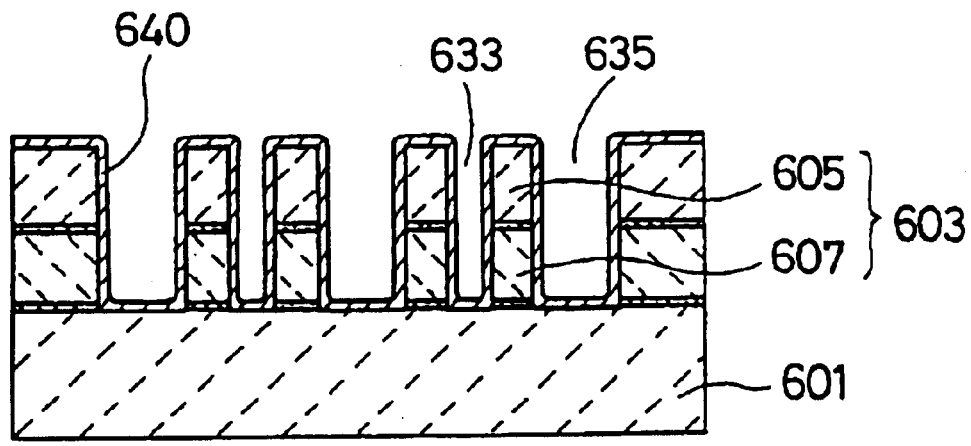
FIG. 3 is a cross-sectional view illustrating the manufacturing process of the ink ejecting device of the first embodiment.

As explained above, an electrode 640 is formed, through the vacuum deposition or the like, with a substance having conductivity as shown in FIG. 3, or the three-layer substrate formed with the first grooves 633 and second grooves 635 that define the ink channels 613 and air chambers 615, respectively, and the actuator walls 603. In this embodiment, nickel, which has excellent corrosion-proof characteristics, has been vacuum-deposited.

Figure 4:
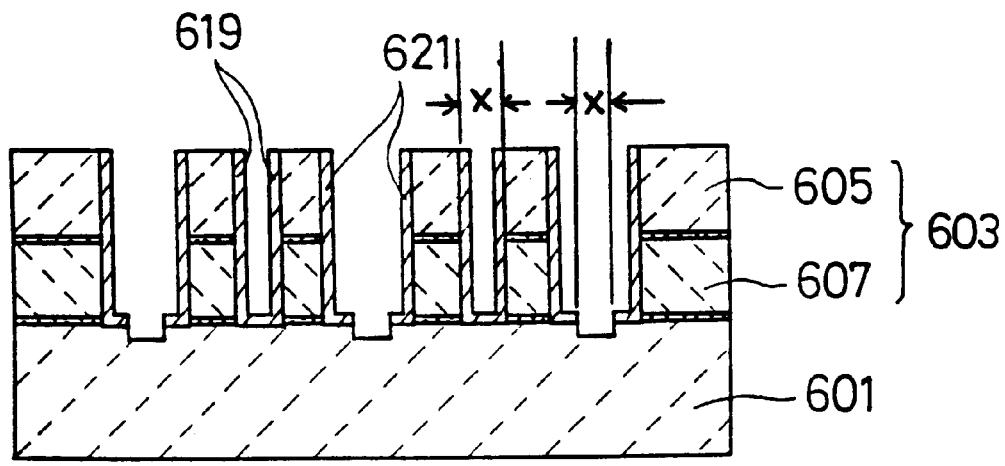
FIG. 4 is a cross-sectional view illustrating the manufacturing process of the ink ejecting device of the first embodiment.

Next, as shown in FIG. 4, the electrodes adhered to the upper parts of upper walls 605 of the actuator walls 603 are removed by a grinding process. In this embodiment, the electrodes are removed by the grinding process, but the electrodes at the upper parts of the upper walls 605 can also be removed by previously coating a resist film at the upper parts of the upper walls 605 before the vacuum deposition and then lifting off the resist after the vacuum deposition of the electrodes.

Next, the electrodes formed on the bottom wall 601 forming the bottom surfaces of the second grooves 635 that define the air chambers 615 are cut a distance X with a similar rotating diamond disk. In this case, if the disk has the width equal to that of the first diamond disk used to form the first grooves 633 (having a width X), it is very economical and reduced cost can be realized because it is no longer necessary to particularly prepare the diamond disk to remove the electrodes formed on the bottom surfaces of the second grooves 635. Furthermore, since the width of the diamond disk used to form the first grooves 633 can be set to the minimum value which ensures formation of such a groove, a line of highly integrated ink channels 613 can be formed, printing resolution can be increased and reduction in size of the ink ejecting device can be realized.

Figure 5:
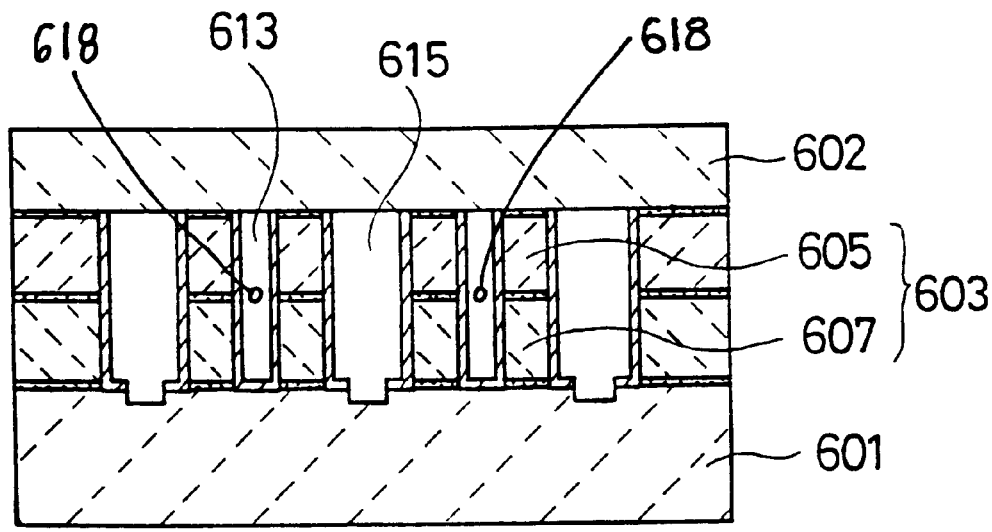
FIG. 5 is a cross-sectional view illustrating the ink ejecting device of the first embodiment.

After electrodes 621 and 619 are formed on the three-layer substrate on which the first grooves 633 and second grooves 635 that define the ink channels 613 and air chambers 615 respectively and the actuator walls 603 are formed, a ceiling wall 602 is bonded to the upper walls 605 as shown in FIG. 5 to form the ink channels 613 and air chambers 615 and provide nozzles 618 and manifolds to complete the ink ejecting device.

As explained above, since the air chamber 615 is formed wider than the ink channel 613 in this embodiment, the electrodes formed at the bottom surfaces of the grooves 635 can be removed reliably without erroneously grinding the electrodes formed on the actuator walls 603. Thereby, cost reduction of the ink ejecting device can be realized, manufacturing yield thereof can be improved and excellent productivity can also be realized.

The electrical connection of the ink ejecting device of this embodiment is not shown (for clarity), but it is similar to and later explained with reference to FIGS. 13A and 13B.

Next, a second embodiment will be explained with reference to FIGS. 6 to 9.

Figure 6:
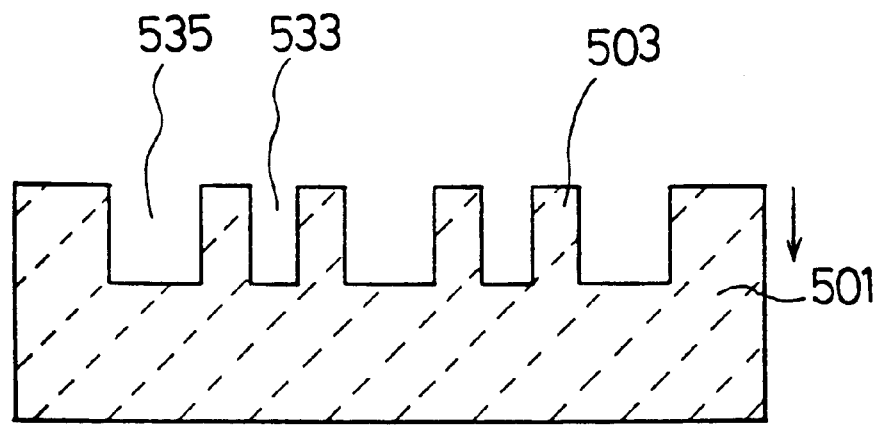
FIG. 6 is a cross-sectional view illustrating a manufacturing process of an ink ejecting device of a second embodiment of the present invention.

As shown in FIG. 6, first grooves 533 and second grooves 535 which will become ink channels 513 and air chambers 515 (refer to FIG. 9), respectively, and actuator walls 503 are formed on a piezoelectric ceramic layer 501 polarized in one direction. In this case, the first grooves 533 which will become the ink channels 513 are formed by a rotating diamond disk having an equal width compared to the ink channel 513. Next, the second grooves 535 which will become the air chambers 515 and the actuator walls 503 are formed. In this case, a diamond disk which is thicker than the disk used to previously form the first grooves 533 is used.

Figure 7:
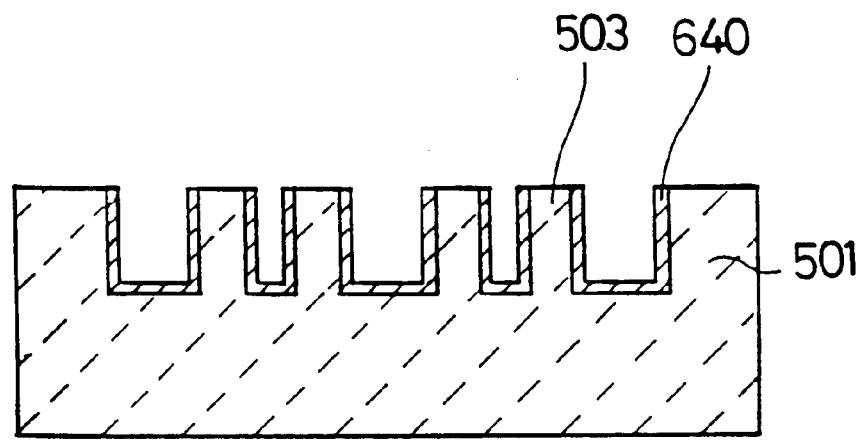
FIG. 7 is a cross-sectional view illustrating the manufacturing process of the ink ejecting device of the second embodiment.
Figure 8:
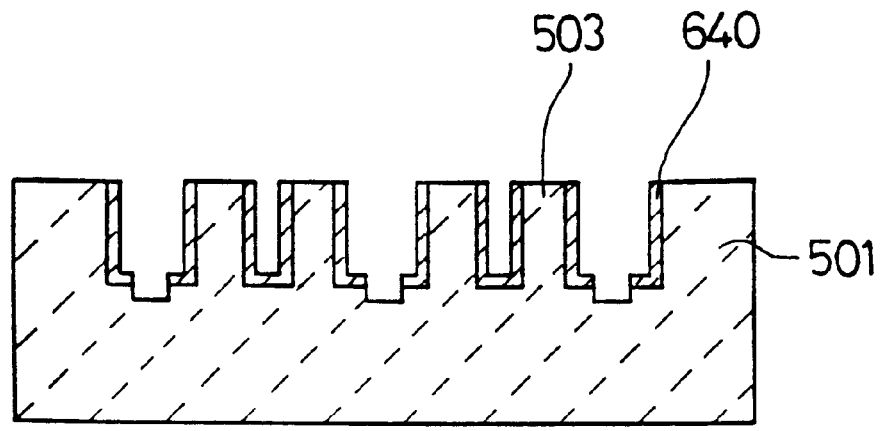
FIG. 8 is a cross-sectional view illustrating the manufacturing process of the ink ejecting device of the second embodiment.

Next, an electrode 640 is formed, by the vacuum deposition method, within the first grooves 533 and the second grooves 535 and on the actuator walls 503. Thereafter, as shown in FIG. 7, the electrodes adhered on the actuator walls 503 are removed by the grinding process or using a resist film. Next, the electrodes formed on the bottom surfaces of the second grooves 515 are cut with a rotating diamond disk.

Figure 9:
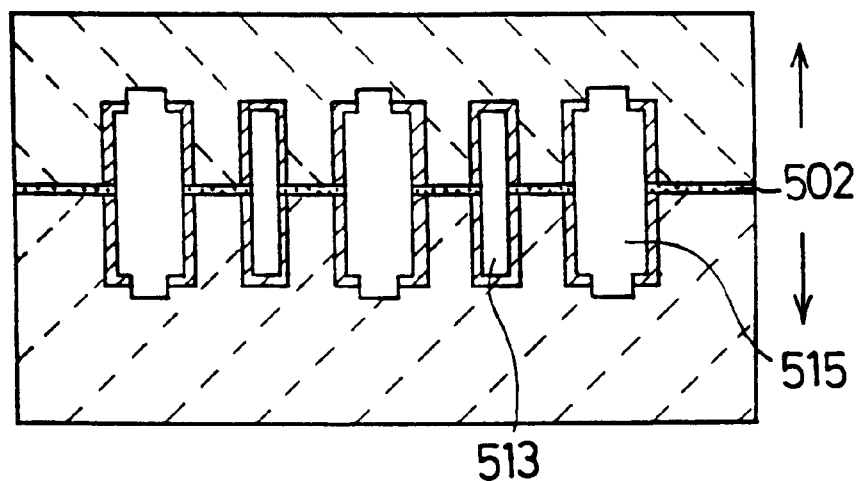
FIG. 9 is a cross-sectional view illustrating the manufacturing process of the ink ejecting device of the second embodiment.

Two piezoelectric ceramic layers 501 formed as described above and shown in FIG. 8 are prepared. As shown in FIG. 9, these two piezoelectric ceramic layers 501 are bonded by a bonding agent 502 in such a manner that the actuator walls 503 are provided face to face to form the ink channels 513 and air chambers 515.

The ink ejecting device of the second embodiment manufactured as explained above offers the effect similar to that of the first embodiment.

A third embodiment will be explained with reference to FIGS. 10 to 12.

Figure 10:
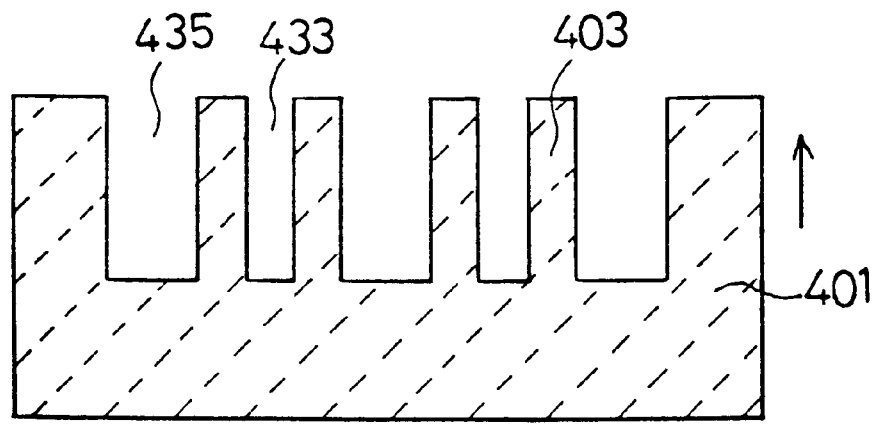
FIG. 10 is a cross-sectional view illustrating a manufacturing process of an ink ejecting device of a third embodiment of the present invention.
Figure 11:
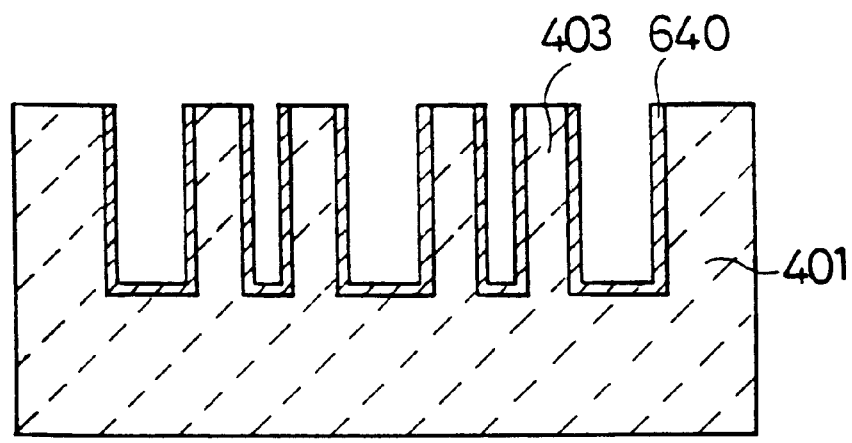
FIG. 11 is a cross-sectional view illustrating the manufacturing process of the ink ejecting device of the third embodiment.

As shown in FIG. 10, first grooves 433 and second grooves 435 which will become ink channels 413 and air chambers 415 (refer to FIG. 12), respectively, and actuator walls 403 are formed on a piezoelectric ceramic layer 401 which is polarized in one direction. In this case, the first grooves 433 which will become the ink channels 413 are formed with a rotating diamond disk having a width equal to the width of the ink channel 413. Next, the second grooves 435 which will become the air chambers 415 and the actuator walls 403 are formed. In this case, a diamond disk which is thicker in width than the disk used to previously form the first grooves 433 is used.

Next, an electrode 640 is formed, by the vacuum deposition method, in the first grooves 433 and second grooves 435 and on the actuator walls 403. As shown in FIG. 11, the electrodes adhered on the actuator walls 403 are removed by the grinding process or using a resist film. Thereafter, the electrodes formed on the bottom surfaces of the second grooves 415 are cut with a rotating diamond disk. The cut electrodes on the bottom surfaces of the second grooves 415 are shown in FIG. 12.

Figure 12:
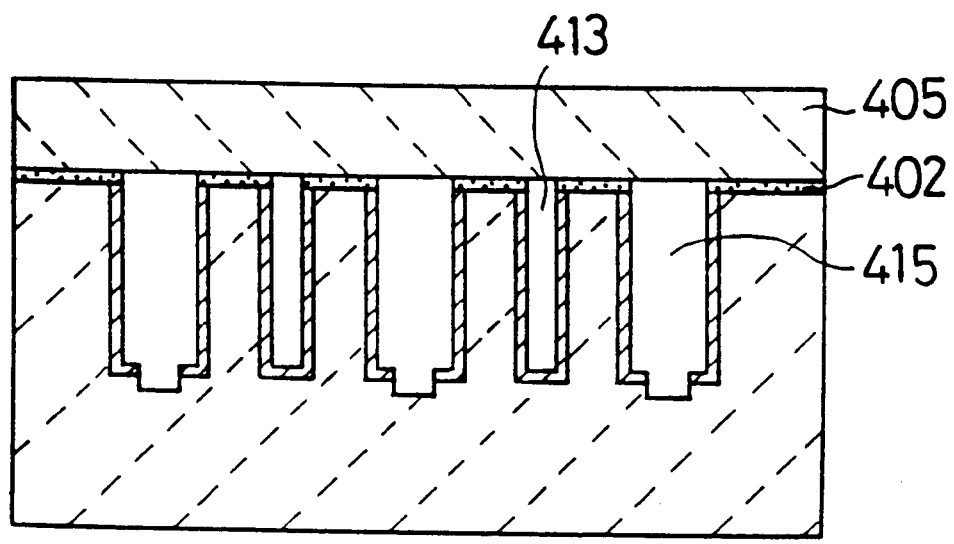
FIG. 12 is a cross-sectional view illustrating the manufacturing process of the ink ejecting device of the third embodiment.

Finally, as shown in FIG. 12, a ceiling wall 405 is bonded to the actuator walls 403 with adhesive 402 to form the ink channels 413 and air chambers 415.

The ink ejecting device of the third embodiment manufactured as explained above also offers the similar effect like the first embodiment.

Figure 13:
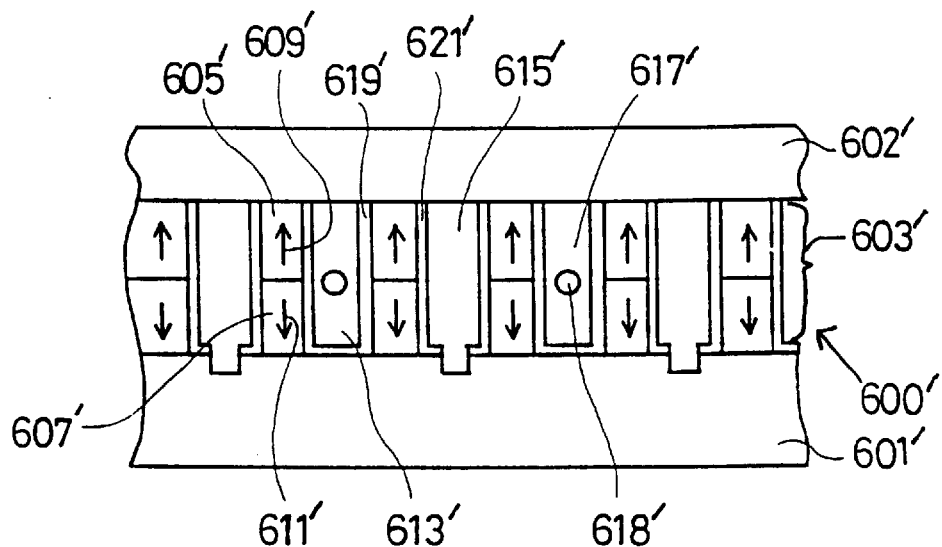
FIGS. 13A and 13B are explanatory diagrams illustrating yet another embodiment of an ink ejecting device according to the present invention.
Figure 13:
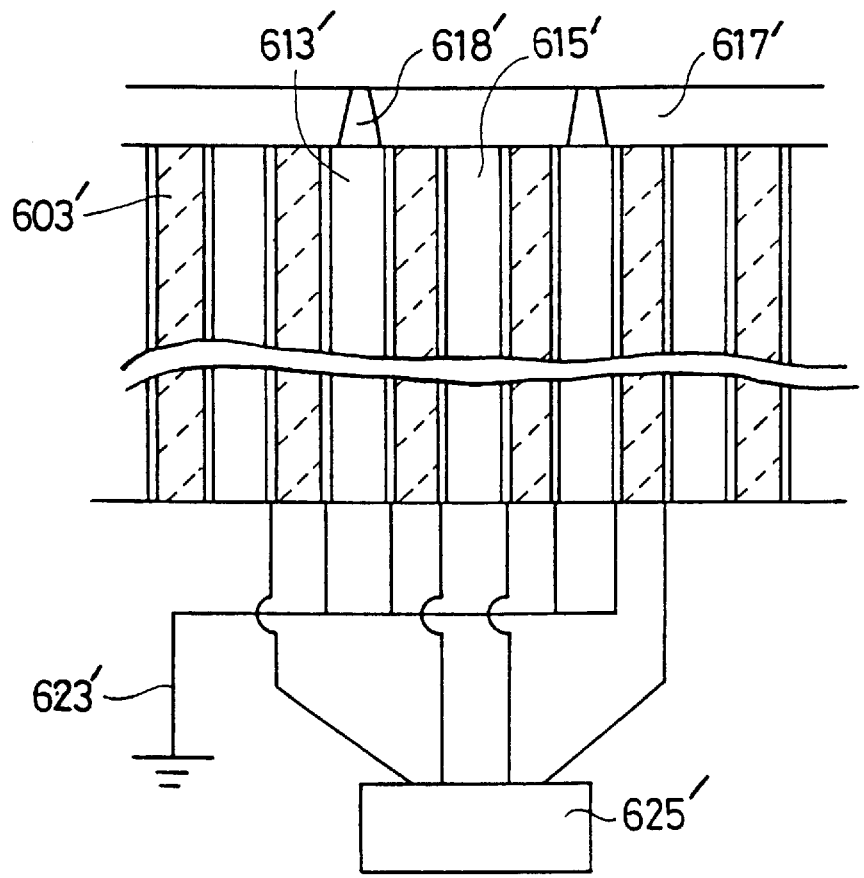

Yet another shear mode type ink ejecting device 600' is shown in FIGS. 13A and 13B. The ink ejecting device 600' is formed of a bottom wall 601', a ceiling wall 602' and shear mode actuator walls 603' provided between the bottom wall 601' and the ceiling wall 602'. The actuator wall 603' includes, for example, a lower wall 607' that is adhered to the bottom wall 601' and is polarized in the direction of an arrow mark 611', and an upper wall 605' that is adhered to the lower wall 607' and the ceiling wall 602' and is polarized in the direction of an arrow mark 609'. The actuators 603' are formed in pairs to form therebetween an ink channel 613'. Also, an air chamber 615' is formed between alternating pairs of the actuators 603' in the same interval as the ink channels 613', as compared to the embodiments of FIGS. 1–12.

A nozzle plate 617' having a nozzle 618' is clamped at one end of the ink channels 613', and metallized electrodes 619' and 621' are provided at both side walls of each actuator wall 603'. The electrodes 619' are formed at the side surfaces of the two actuator walls 603' forming the internal surface of the ink channel 613' and are also formed at the bottom walls 601'. Namely, the electrodes formed at the side surfaces of the two actuator walls 603' facing the ink channel 613' have electrical continuity. Meanwhile, the electrodes 621' are formed at the side surfaces of the two actuator walls 603' forming the internal surface of the air chamber 615', but are not formed at the bottom wall 601', unlike the electrodes 619'. Namely, the electrodes 621' formed at the both actuator walls 603' facing to the air chamber 615' do not have electrical continuity. The electrodes 619' provided within the ink channels 613' are connected to ground 623', while the electrodes 621' provided in the side of the air chambers 615' are connected to a silicon chip 625' serving as an actuator drive circuit.

Next, a method of manufacturing the ink ejecting device 600' will be explained. First, a piezoelectric ceramic layer polarized in the direction of the arrow mark 611' is bonded to the bottom wall 601', and a piezoelectric ceramic layer polarized in the direction of the arrow mark 609' is further bonded thereon. The thickness of the piezoelectric ceramic layers is equal to the height of the lower wall 607' and the upper wall 605'. Next, parallel grooves are formed on the piezoelectric ceramic layer with a first rotating diamond disk to form the actuator wall 603' joining the lower wall 607' and the upper wall 605' with each other. Electrodes are formed, by vacuum deposition, at the internal surfaces of the grooves and at the top of the actuator walls 603'. Since electrodes are formed along all of the internal surfaces of the grooves that will become the air chambers 615' immediately after the vacuum deposition, the conductive electrodes are cut out on the bottom wall 601' of the grooves which become the air chambers 615' with a second rotating diamond disk, which is thinner than the first diamond disk used to previously form the actuator walls 603'.

Next, the electrodes 619' and 621' are formed by removing the electrodes adhered to the top of the actuator walls 603' with a grinding process or providing a resist layer. Moreover, the ceiling wall 602' is bonded to the upper walls 605' of the actuator walls 603' to close the grooves, in view of forming the ink channels 613' and the air chambers 615'. Next, a nozzle plate 617' provided with nozzles 618' is bonded to one end of the bottom wall 601', the ceiling wall 602' and the actuator wall 603' in such a manner that the nozzle 618' corresponds to the ink channel 613', while the ground 623' and the silicon chip 625' are connected to the electrodes 619' and 621' at the other end.

Because the electrode 619' formed at the side surface of the actuator wall 603' within each ink channel 613' is connected to ground 623', when a voltage is applied (from the silicon chip 625') to the electrodes 621' formed in the sides of the air chambers 615' of the actuator walls 603' in both sides of a predetermined ink channel 613', the actuator walls 603' in both sides of the predetermined ink channel 613' show piezoelectric thickness shear mode deformation in such a direction as to increase the volume of the ink channel 613'. After a predetermined period, application of the voltage is ceased. Thereby, the volume of the ink channel 613 is returned to the natural condition. Thereby, pressure is applied to the ink within the ink channel 613' and an ink droplet- is ejected from the nozzle 618'.

In the ink ejecting device 600' having the structure explained above, the ink channel 613' and the air chamber 615' have equal groove widths. Therefore, when the electrode is to be cut on the bottom wall 601' forming the bottom surface of the groove to separate the electrode 621' within the air chamber 615', the width of the second diamond disk must naturally be thinner than that of the disk used to form the groove. Here, the optimum groove width of the ink channel 613' is about 40 to 100 μm, although it is different depending on the ink used and voltage to be applied, and it is preferable to be as narrow as possible to realize reduction in size and enhancement of resolution. Moreover, the desirable height of the actuator wall 603', that is, the desirable depth of the ink channel 613' is about 100 to 400 μm.

Accordingly, as compared to the embodiments of FIGS. 1–12, in the embodiment of FIGS. 13A and 13B, it is more difficult to cut the electrode provided on the bottom surface of the air chamber 615' in the groove which is narrower than the ink channel 613' and the air chamber 615', which are formed as narrow as possible. Moreover, it is more difficult to form the bottom part of the narrow groove to have a higher height to width ratio, and this process has decreased productivity and increases cost compared to the embodiments of FIGS. 1–12. In addition, when the width of the second diamond disk is not sufficiently thinner than the groove width, a disadvantage can occur because the electrode formed on the actuator wall 603' within the groove may be cut by mistake.

The present invention is not limited the embodiments explained above and allows various changes or modifications without departure from the scope of the appended claims.

What is claimed is:

1. A method of manufacturing a substrate of an ink ejecting device, the method comprising the steps of:

preparing a substrate plate such that at least a part of the substrate plate is formed of piezoelectric ceramics;

forming first grooves in the substrate plate that define ejecting channels that eject ink;

forming at least one second groove on each side of each of the first grooves to define non-ejecting channels and actuator walls between the first grooves and the second grooves;

forming a conductive layer over internal surfaces of the first grooves and the second grooves and over the actuator walls; and removing a portion of the conductive layer that is formed at a bottom surface of each of only the second grooves without removing any other portions of the conductive layer formed over the first grooves and the second grooves during the step of removing.

2. The method according to claim 1, the method further comprising the step of:

removing a portion of the conductive layer that is formed on a top surface of each of the actuator walls.

3. The method according to claim 2, further including the step of forming the first grooves and the at least one of the second grooves on each side of each of the first grooves such that a width of each of the second grooves is not smaller than a width of each of the first grooves.

4. The method according to claim 2, further including the steps of connecting each of the second grooves to a voltage source, and grounding each of the first grooves.

5. The method according to claim 2, wherein the step of removing the conductive layer that is formed on a top surface of each of the actuator walls includes removing the conductive layer by a grinding process.

6. The method according to claim 2, wherein the step of removing the conductive layer that is formed on the top surface of each of the actuator walls includes coating a resist film on each of the actuator walls prior to forming the conductive layer, and removing the resist film subsequent to forming the conductive layer.

7. The method according to claim 1, wherein the removing step includes removing the portion of the conductive layer with a rotating disk cutting tool.

8. The method according to claim 1, wherein the substrate plate includes two piezoelectric ceramic layers, the method further including polarizing the two piezoelectric ceramic layers in opposite directions.

9. The method according to claim 1, wherein the step of forming the conductive layer includes forming the conductive layer by vapor deposition.

10. The method according to claim 1, wherein a width of the portion of the conductive layer that is removed being not greater than a width of each of the first grooves.

11. The method according to claim 1, further including the step of forming the first grooves and the at least one of the second grooves on each side of each of the first grooves such that a width of each of the second grooves is not smaller than a width of each of the first grooves.

12. The method according to claim 1, further including the steps of connecting each of the second grooves to a voltage source, and grounding each of the first grooves.

13. The method according to claim 1, wherein the step of forming first grooves includes forming first grooves with one rotating disk cutting tool, and the step of removing the portion of the conductive layer includes removing the portion of the conductive layer with another rotating disk cutting tool, the one rotating disk cutting tool and the other rotating disk cutting tool having equal widths.

14. The method according to claim 1, wherein the step of forming the conductive layer includes forming the conductive layer of nickel that is substantially corrosion-proof.

15. The method according to claim wherein the step of forming first grooves includes forming first grooves such that each of the first grooves has a width of 40 to 100 μm.

16. The method according to claim 1, wherein the step of forming first grooves includes forming first grooves such that each of the first grooves has a depth of 100 to 400 μm, and the step of forming at least one second groove on each side of the first grooves includes forming at least one second groove on each side of the first grooves such that each of the second grooves has a depth of 100 to 400 μm.

17. The method according to claim 1, the method further comprising the step of:

encasing the ejecting channels and the non-ejecting channels with a nozzle plate.

18. The method according to claim 17, wherein the removing step includes removing the portion of the conductive layer with a rotating disk cutting tool.

19. The method according to claim 18, wherein the piezoelectric ceramic plate includes two piezoelectric ceramic layers, the method further including polarizing the two piezoelectric ceramic layers in opposite directions.

20. The method according to claim 17, wherein the step of forming the conductive layer includes forming the conductive layer by vapor deposition.

21. The method according to claim 17, wherein the selected portions of internal surfaces of the first grooves and the second grooves include all internal surfaces of the first grooves and the second grooves.

22. The method according to claim 17, wherein a width of the portion of the conductive layer that is removed being not greater than a width of each of the first grooves.

23. The method according to claim 17, further including the step of forming the first grooves and the at least one of the second grooves on each side of each of the first grooves such that a width of each of the second grooves is not smaller than a width of each of the first grooves.

24. The method according to claim 17, further including the steps of connecting each of the second grooves to a voltage source, and grounding each of the first grooves.

* * * * *